Figure 1:
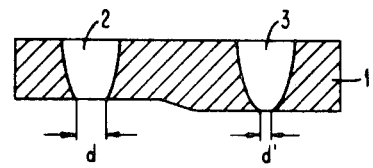

United States Patent [19]

Ruh et al.

[11] 4,066,491
[45] Jan. 3, 1978

[54] METHOD OF SIMULTANEOUSLY ETCHING MULTIPLE TAPERED VIADUCTS IN SEMICONDUCTOR MATERIAL

[75] Inventors: Wolf-Dieter Ruh; Gerhard Trippel, both of Sindelfingen, Germany

[73] Assignee: International Business Machines Corporation, Armonk, N.Y.

[21] Appl. No.: 781,616

[22] Filed: Mar. 28, 1977

[30] Foreign Application Priority Data

June 12, 1976 Germany .............................. 2626420

[51] Int. Cl.² .................... B23P 15/00; B23P 25/06
[52] U.S. Cl. ................................ 156/644; 156/643; 156/646; 156/657; 156/659; 204/192 E; 239/601
[58] Field of Search ............... 156/643, 644, 646, 659, 156/657, 662, 667; 204/192 E, 192 EC; 346/75; 239/601

[56] References Cited

U.S. PATENT DOCUMENTS

| 3,474,021 | 10/1969 | Davidse et al. | 204/192 E |
| 3,958,255 | 5/1976 | Chiou et al. | 156/644 X |

*Primary Examiner*—William A. Powell
*Attorney, Agent, or Firm*—George E. Roush

[57] ABSTRACT

Several tapered viaducts or through-holes of uniform size are simultaneously fabricated by etching in a dielectric plate or substrate. The viaducts, which are designed in particular for nozzles for ink jet printers, have identical orifice widths, irrespective of differences in the thickness of the substrate or dielectric plate or different etch rates in the various areas of the dielectric plate. The holes are first chemically pre-etched until the first hole is about to penetrate through the plate and subsequently sputter etching is applied until all holes have penetrated through the plate, whereby the dielectric plate provides the necessary sputter etch capacity on which a negative bias occurs.

8 Claims, 5 Drawing Figures

METHOD OF SIMULTANEOUSLY ETCHING MULTIPLE TAPERED VIADUCTS IN SEMICONDUCTOR MATERIAL

The invention relates to a method of simultaneously etching several conical viaducts or through-holes in a dielectric plate or substrate, and it particularly pertains to the fabrication of nozzles for ink jet printers, however, it is not limited thereto.

Several closely adjacent nozzles are required for some ink jet printing. These nozzles are arranged in a plate forming one wall of an ink tank. The ink in the tank is caused to oscillate, for example, by means of a piezoelectric crystal. During ink jet printing by means of multiple nozzles, drops are simultaneously ejected by all the nozzles, and a charge electrode is arranged in front of each nozzle in the area where the drops are formed. A constant deflecting field ensures that the drops charged by the charging electrode are deflected in such a manner that they do not reach to paper. Only the uncharged drops fly against the paper in a substantially straight line, forming the characters. Such ink jet printers with several nozzles are described, for example, in U.S. Pat. No. 3,373,437.

A prior U.S. patent application Ser. No. 537,799, filed on Dec. 31, 1974, for "Nozzles Formed in Monocrystalline Silicon", thereafter issued on Nov. 25, 1976 as U.S. Pat. No. 3,921,916; and described nozzles fabricated by etching a semiconductor chip. A similar nozzle forms the subjectmatter of another prior U.S. patent application Ser. No. 543,600, filed on May 21, 1975, for "Square Ink Jet Nozzles in Silicon" thereafter issued on Feb. 8, 1977 as U.S. Pat. No. 4,007,464. In accordance with this older patent application, the plate into which the nozzles are etched may be made of semiconductor material or monocrystalline silicon. These previously proposed nozzles have, for example, a pyramidally tapered cross-section. In etching, one surface is initially photoresist coated and then exposed and developed, so that the etchant attacks only predetermined regions.

Unfortunately, it is very difficult to produce substrate or plates having a totally uniform thickness from the abovementioned materials. Nonuniform thicknesses are particularly detrimental where several tapered nozzles are to be etched simultaneously. It is obvious that in a thin plate area such a nozzle will have a larger orifice than in a thicker area, if both nozzles are etched simultaneously. Because of their improved emission characteristics, tapered, such as conical or pyramidal, nozzles are desirable for ink jet printers.

IBM Technical Disclosure Bulletin, Vol. 17, No. 11, April 1975, pp. 3450–52, also describes a method of simultaneously etching several nozzles in a silicon plate. In order to obtain tapered nozzles with identical orifice widths, irrespective of differences in the thickness of the silicon plate, differences in the thickness of the plate are compensated for during the exposure of the photoresist layer. This is achieved by changing the size of the exposure area or, in the case of square exposure surfaces, by tilting them in relation to the direction of the silicon plate. These known methods of changing the surfaces attacked by the etchant necessitate that the photoresist-free area associated with each nozzle is produced separately and that the thickness of the silicon plate is measured in those areas where a nozzle is to be etched.

A further method for producing nozzles having identical orifice widths is described in IBM Technical Disclosure Bulletin, Vol. 18, No. 1, June 1975, p. 225. This known method provides for an acid to be forced through the nozzle that has been completely broken through. Behind the nozzle the acid forms a jet which impinges upon an electrode connected to the nozzle by way of an electric current and the acid. During this process, the orifice of the nozzle is expanded to a predetermined uniform width. The electric circuit comprises an ammeter which, as the jet becomes thicker, indicates an increasing current. As soon as the current has reached a predetermined magnitude, the current source is cut off, thus terminating the etch process and the expansion of the nozzle. This control circuit is duplicated several times, there being one behind each nozzle. The circuit can also be cut off automatically. However, for the manufacture of tapered and very small nozzles, this method is unsuitable, since the thickness of the etchant jet has to be sizable before a measurable current starts to flow. In addition, in the case of multiple nozzles, each nozzle has to be provided with an etchant supply and a control circuit of its own.

It is an object of the invention to provide a method permitting several tapered through-holes to be simultaneously produced in a plate by means of etching, whereby said holes, irrespective of differences in the plate thickness or the etch rates caused, for example, by inhomogeneities in the plate structure, have identical orifice widths. The method in accordance with the invention requires no control circuit and is very easy to apply.

The invention is characterized to obtain holes whose orifice widths are identical, irrespective of differences in the plate thickness or the etch rates, the holes are first chemically pre-etched until the first hole is about to break through, and that subsequently high-frequency sputter etching is applied until all holes have been broken through, whereby the dielectric plate provides the capacity on which a negative bias is encountered.

The method in accordance with the invention will be described in greater detail hereinafter, by way of example only, with reference to the accompanying drawing forming part of the specification, and in which:

FIG. 1 is a graphical representation showing how the width of a nozzle orifice is a function of the plate thickness in the absence of corrective measures; and FIGS. 2A to 2D are graphical representations showing the steps of a method of etching viaducts in semiconductor material in accordance with the invention.

FIG. 1 shows how the nonuniform thickness of a semiconductor plate 1 affects the orifice width $d$, $d'$ of tapered viaducts or through-holes 2, 3 fluid-etched into a substrate or plate 1. If, for example, the difference in thickness of the plate 1 between the hole 2 and the hole 3 is about 1 micrometer, then $d$ and $d'$ will also differ about 1 micrometer. With the usual orifice diameters of, 5 micrometer, for instance, 1 micrometer difference represents a substantial variation.

The orifice width of the tapered viaducts or through-holes can also be influenced by other inhomogeneities of the substrate or plate 1. If the plate 1 is made of crystalline material, such inhomogeneities may comprise defects in the crystal structure, which defects are encountered in particular in the peripheral area of such crystals. Finally, differences in the orifice widths of through-holes may be caused by nonuniform action of the etchant, because the openings in the etching mask are of difference sizes, or by differences in the flow rates making the etchant more intensive in some areas than in others.

All these potential possibilities of defects are obviated by the method in accordance with the invention, so that the method in accordance with the invention, which will be described below with reference to FIGS. 2A to 2D, invariably produces viaducts or through-holes of identical orifice widths.

Figure 2A:
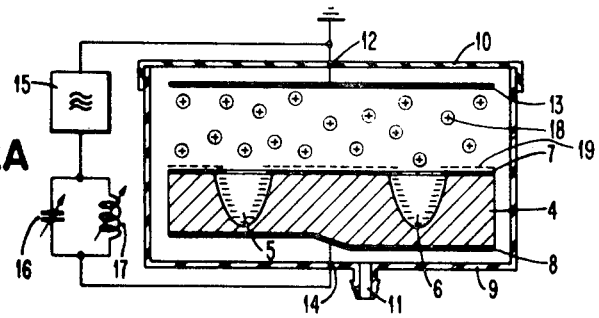

In FIG. 2A, there is shown a substrate or plate 4 through which the viaducts or through-holes are to be bored. Into this plate 4, holes 5 and 6 have been fluid-etched. If the substrate is to be used as a nozzle plate for an ink jet printer, the number of nozzles required will, of course, have to be greater, for example, 20. For the sake of simplicity, the drawing shows only two nozzles which suffice to illustrate the principle of the invention. As a result of the undercutting encountered during the fluid etching, these holes are approximately conical. This fluid etch process is interrupted before the first of these holes has reached the reverse of the plate 4. To the obverse of the plate or substrate 4, an etching mask 7 is applied consisting of photoresist which has openings in the areas where the viaducts or holes are to be generated. These openings are produced by exposing and subsequently developing the resist. This photolithographic method need not be described here in detail, since it is known semiconductor technology. Although the etching mask 7 which was necessary for the chemical etch process before the inventive steps are taken is not absolutely necessary during these latter steps, it is required for a subsequent step. It does not interfere with the method in accordance with the invention and therefore remains on the plate 4 also during those steps.

After the substrate or plate 4 has been provided with holes 5 and 6, which at that stage do not extend through the full thickness of the plate, a metal electrode 8 is applied to the reverse side. This metal electrode may be vapor deposited. It may also take the form of a flexible metal plate that fits closely against the lower surface of the plate 4. Then the plate 4 with electrode 8 is placed in a vessel 9 vacuum sealed by the lid 10. Vessel 9 has a nipple 11, through which the receiver consisting of vessel 9 and lid 10 is exhausted and by way of which gas, whose significance will be described later, is introduced.

Incorporated in the lid 10 is an electric lead passing through a viaduct 12 to which a plate-shaped electrode 13 is attached. The electrode 13 forms the counterpart to the electrode 8 which by way of another electric lead passing through a viaduct 14 in the vessel 9 is connected to the circuit described below. The electrodes 13 and 8 are arranged at a distance of, for example, 5 – 10 centimeters from each other. The thickness of the plate 4 is, for example, 0.20 millimeters. The circuit comprises a high-frequency generator 15 which emits a frequency of, for example, 13 MHz at 200 volts. A capacitor 16 and an indicator 17 connected in parallel are connected in series to the high-frequency generator 15. At least one of these circuit elements must be variable — both elements are variable as shown — in order to tune the electric circuit connected to the high-frequency generator 15 to resonance. This resonance tuning has the advantage that the voltage between the electrodes 13 and 8 can be adjusted optimally. The parallel connection of the capacitor 16 and the inductor 17 is connected to the plate 8 through the viaduct 14 and to the plate 13 through a viaduct 12. The plate 13 is also connected to ground and to high-frequency generator 15. The apparatus described thus far serves to further process the chemically etched plate 4. As sputter etching is effected by the kinetic energy or ions, a gas must be introduced, through the nipple 11, into the receiver formed by the vessel 9 and the lid 10. This gas is preferably argon, since argon does not react chemically and is heavy. This means that the argon ions are equally heavy and permit rapid high-frequency sputter etching as a result of the high kinetic energy. The pressure of the argon in the receiver 9, 10 is about 1 to 15 . $10^{-1}$ Torr. In the place of argon, crypton having similar characteristics can be used, however, it is more expensive than argon.

High-frequency sputter etching is possible only where one of the electrodes serving as a workpiece acts or operates in the manner of a "capacitor." In accordance with the invention, the "capacitor" is effectively formed with the substrate or plate 4, being a dielectric material, as representing the dielectric material of a capacitor. Suitable materials for the plate 4 are silicon, (Si), quartz ($SiO_2$), aluminum oxide ($Al_2O_3$), or boron nitride (BN).

As a result of the high-frequency field between the metallic electrodes 13 and 8, a plasma of positive argon ions 18 and electrons 19 develops. In accordance with the oscillations of the voltage applied the argon ions 18 and the electrons 19 impinge upon the top surface of the plate 4. Because of the different masses, (the mass of an argon ion 18 is about 80,000 times that of an electron 19), and the higher mobility of the electrons 19 this entails, the number of electrons 19 reaching the surface of the plate 4 during the positive half wave on the electrode 8 substantially exceeds the number of argon ions 18 encountered during the subsequent negative half wave. Because the electrons 19 reaching the surface of the plate 4 cannot be discharged by way of the insulator 4, they negatively charge the space in front of the plate 4. At this point, the impinging argon ions 18 can be neutralized. The electrons used for this purpose are replaced by a glow discharge. The negative space charge present on the plate 4 in a state of equilibrium constitutes a negative bias of this plate in relation to the discharge path superimposed by the high-frequency electric field. The electrons 19 form on the surface of the plate 4 as well as on the walls of the viaducts or holes 5 and 6, a space charge cloud attracting the argon ions 18 which then knock particles out of the surface of the plate 4, thus enlarging the holes 5 and 6.

Figure 2B:
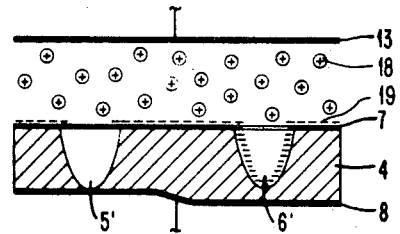

As soon as the hole, as shown in FIG. 2B, has been expanded as far as the electrode 8, the high-frequency sputter etch process is terminated in the area of this hole, since at that stage the space charge cloud of electrons 19 in this hole area can flow to the electrode 8, so that for lack of bias further argon ions 18 are prevented from reaching this area. The difference in intensity of the ion bombardment can be increased by applying positive bias to the electrode 9. In FIG. 2B the viaduct or hole which is the first to penetrate the full plate thickness is hole 5 which at the stage has the expanded size of the hole 5'. Because of the greater thickness of the plate 4 in the area of the hole 6, which similar to the hole 5' has been sputter etched to the size of the hole 6', the latter hole does not yet extend through the full thickness of the plate.

Figure 2C:
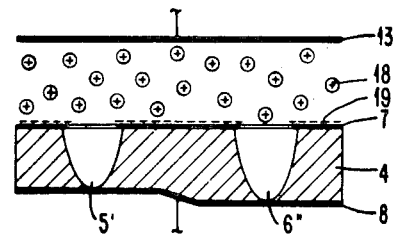
Figure 2D:
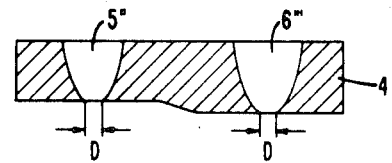

High-frequency sputter etching is continued until the last hole — in FIG. 2C the hole concerned is hole 6 — has been expanded to hole 6" in such a manner that it extends to electrode 8. At this stage the electron space charge cloud in hole 6" is discharged to the electrode 8, so that also in the case the high-frequency sputter etch process is rendered ineffective for lack of a negative bias. From state 2B to state 2C, the hole 5' does not increase or increases only slightly in its wider top regions. After the state shown in FIG. 2C has been reached, the high-frequency sputter etch process can be terminated and the substrate or plate 4 be removed from the receiver 9, 10. No detrimental effects are produced by continuing the sputter etch process for a while, so that the time at which this process is discontinued is not critical. Subsequently, the electrode 8, provided that it was vapor deposited, can be removed by chemical etching. If the nozzle openings of holes 5' and 6" are too small, they can be expanded in a subsequent chemical etch process. During this process using an etching fluid, the two holes are uniformly expanded. After this step the photoresist mask which was necessary for the subsequent chemical etch process is removed by means of the known ashing process. The final product obtained is the plate shown in FIG. 2D, which comprises the conical viaducts or through-holes 5" and 6'". The orifice diameters D of the two viaducts or through-holes 5" and 6'" are identical.

While the invention has been shown and described particularly with reference to a preferred embodiment thereof, and variations have been suggested, it should be clearly understood that those skilled in the art will make changes without departing from the spirit and the scope of the invention as defined in the appended claims.

The invention claimed is:

1. A method of fabricating a semiconductor substrate having a plurality of core-shaped viaducts therein of substantially uniform orifice dimensions at the obverse of said substrate, comprising the steps of
   photolithographically covering the surface of said substrate at the reverse of said substrate with a pattern having locating holes at which said viaducts are desired,
   etching said substrate to form depressions at said holes in said substrate stopping short of penetrating said substrate at said obverse thereof,
   metalizing said obverse of said substrate to form a metalized layer thereat,
   etching said depressions further by bombardment of ions from said reverse of said substrate to said metalized layer at said obverse, and
   stripping said metalized layer from said substrate.

2. A method of fabricating a semiconductor substrate having a plurality of core-shaped viaducts therein of substantially uniform orifice dimensions at the obverse of said substrate, comprising the steps of
   etching depressions by a chemical etching method to a depth short of penetrating said substrate at said obverse thereof, and
   etching said depressions further by a sputter etching method until said viaducts penetrate said obverse, whereby said uniform orifices are formed.

3. A method of fabricating a semiconductor substrate as defined in claim 2 and incorporating
   an intermediate step of
   metalizing said obverse of said substrate to form an electrode for the subsequent step of sputter etching, and
   a final step of
   stripping said substrate of said metalized electrode.

4. A method of fabricating a semiconductor substrate as defined in claim 3 and incorporating
   a further step of
   expanding said viaducts in said substrate by a method of chemical etching.

5. A method of fabricating a semiconductor substrate as defined in claim 2 and incorporating
   an intermediate step of
   depositing metal vapor on said obverse of said substrate to form an electrode for the subsequent step of sputter etching.

6. A method of fabricating a semiconductor substrate as defined in claim 5 and incorporating
   a further step of
   subjecting said metalized substrate to sputter gas of the class comprising argon and crypton.

7. A method of fabricating a semiconductor substrate as defined in claim 6 and wherein
   said substrate is a material of the class comprising silicon, quartz, aluminium oxide, and boron-nitride.

8. A method of fabricating a semiconductor substrate as defined in claim 2, said method comprising the steps of
   etching depressions by a chemical method to a depth short of penetrating said substrate at said obverse thereof, and
   vaporizing a metal on said obverse of said substrate for forming an electrode thereon,
   arranging said substrate in parallel relationship to a complementary electrode spaced therefrom and located on the side thereof remote from said vaporized metal electrode,
   enclosing said electrode and said substrate in a gaseous atmosphere,
   applying high-frequency ionizing electric potential across said electrodes for sputter etching said depressions for penetrating said substrate to said vaporized metal electrode, and
   stripping said metalized electrode from said substrate.

* * * * *